US012733200B2

(12) United States Patent
Mills et al.

(10) Patent No.: US 12,733,200 B2
(45) Date of Patent: Sep. 8, 2026

(54) NON-EPITAXIAL ELECTRICAL COUPLING BETWEEN A FRONT SIDE TRENCH CONNECTOR AND BACK SIDE CONTACTS OF A TRANSISTOR

(71) Applicant: Intel Corporation, Santa Clara, CA (US)

(72) Inventors: Shaun Mills, Hillsboro, OR (US); Ehren Mannebach, Tigard, OR (US); Joseph D'Silva, Hillsboro, OR (US); Kalyan Kolluru, Portland, OR (US); Mauro J. Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 17/710,857

(22) Filed: Mar. 31, 2022

(65) Prior Publication Data

US 2023/0317850 A1 Oct. 5, 2023

(51) Int. Cl.

| | |
|---|---|
| ***H10D 30/62*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ..... *H10D 30/6215* (2025.01); *H10D 84/0158* (2025.01); *H10D 84/038* (2025.01); *H10D 84/834* (2025.01)

(58) Field of Classification Search

CPC ........... H10D 30/6215; H10D 84/0158; H10D 84/834; H10D 84/038

See application file for complete search history.

(56) References Cited

U.S. PATENT DOCUMENTS

| | | | | |
|---|---|---|---|---|
| 2019/0164882 | A1* | 5/2019 | Chen | H10D 84/834 |
| 2021/0343639 | A1 | 11/2021 | Wang | |
| 2021/0343645 | A1* | 11/2021 | Peng | H10D 84/0149 |
| 2022/0028895 | A1* | 1/2022 | Kim | H01L 23/5286 |
| 2022/0077062 | A1* | 3/2022 | Van Dal | H10D 84/038 |
| 2022/0406715 | A1* | 12/2022 | Xie | H10D 84/0184 |

OTHER PUBLICATIONS

Search Report from European Patent Application No. 23158708.0, mailed Aug. 7, 2023, 9 pgs.

* cited by examiner

*Primary Examiner* — Christine A Enad

(74) *Attorney, Agent, or Firm* — Schwabe, Williamson & Wyatt P.C.

(57) ABSTRACT

Embodiments described herein may be related to creating a low resistance electrical path within a transistor between a front side trench connector and back side contacts and/or metal layers of the transistor. The low resistance electrical path does not go through a fin of the transistor that includes epitaxial material, but rather may go through a conductive path that does not include an epitaxial material. Embodiments may be compatible with a self-aligned back side contact architecture, which does not rely on deep via patterning. Other embodiments may be described and/or shown.

20 Claims, 10 Drawing Sheets

100a
102
104
106
108
112
114
104b
116
104a
116
104
110

NON-EPITAXIAL ELECTRICAL COUPLING BETWEEN A FRONT SIDE TRENCH CONNECTOR AND BACK SIDE CONTACTS OF A TRANSISTOR

FIELD

Embodiments of the present disclosure generally relate to the field of semiconductor packaging, and in particular to transistor structures with trench connectors.

BACKGROUND

Continued growth in virtual machines, cloud computing, and portable devices will continue to increase the demand for power routing in transistors that are included within chips and packages.

DETAILED DESCRIPTION

Figure 1:
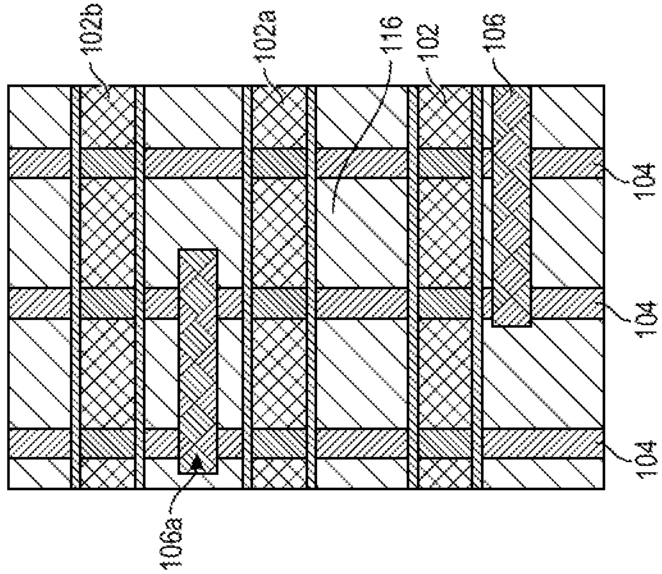
FIG. 1 shows a perspective view and a top-down view of a FinFET transistor that includes a non-epitaxial electrical coupling between a trench connector and a backside connector, in accordance with various embodiments.

Embodiments described herein may be related to creating a low resistance electrical path between a front side trench connector of a transistor and back side contacts and/or backside metal layers of the transistor. In embodiments, the backside metal layers may be referred to as a backside trench connector network (TCN). In embodiments, the low resistance electrical path may be referred to as a low resistance feedthrough. In embodiments, the low resistance electrical path does not go through a fin of the transistor, but rather goes through a conductive path that does not include an epitaxial material. Embodiments described herein may be compatible with a self-aligned back side contact architecture. As a result, embodiments may not rely on a deep via patterning process to implement the low resistance electrical path. As a result, deep via processing steps may be eliminated, thus avoiding manufacturing complexity.

In embodiments, the low resistance electrical path may be formed by patterning a backside TCN in regions that do not include epitaxial depositions, for example for fins of a FinFET transistor implementation is described further below. Subsequently, metal-to-metal contact may be made directly to the front side trench connector, which may be part of a front side TCN. These embodiments may be used in conjunction with the backside TCN to replace deep power via architectures for Advanced Technology nodes. In legacy implementations of deep power vias, power is routed around the cell, which increases the footprint of the cell. In implementations described herein, backside TCN connects to a device directly from the backside, and does not add to the cell footprint. Low resistance feedthrough between the front side and the backside of a transistor are beneficial for analog mixed signal (AMS) structures. Embodiments that use AMS structures, for example for high-speed I/O, that are incorporated into backside trench contact network architecture may use the approaches described herein.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 shows a perspective view and a top-down view of a FinFET transistor that includes a non-epitaxial electrical coupling between a trench connector and a backside connector, in accordance with various embodiments. Transistor 100*a* shows a perspective view of a portion of a FinFET transistor, and transistor 100*b* shows a top-down view of a portion of a similar FinFET transistor. Transistor 100*a* includes a gate 102 with a plurality of fins 104 that extend through the gate 102. As shown, the plurality of fins 104 are substantially parallel to each other, and overlap each other in a direction parallel to a direction of the gate 102. Fins 104*a*, 104*b* may be electrically coupled with a trench connector 106. In embodiments, the trench connector 106 may be a portion of a front side TCN for the transistor 100*a*. In embodiments, the fins 104 may be separated by a dielectric 116.

A backside of the transistor 110 may include a backside connection layer 112 that may be on a backside metal zero (BM0) layer 114. In embodiments, a connector 108 directly electrically couples the trench connector 106 with the backside connection layer 112. In other embodiments, the connector 108 may directly electrically couple with some other electrically conductive feature (not shown) in the backside of the transistor 110. In embodiments, the connector 108 does not include any epitaxial material. In embodiments, the connector 108 may include a metal, including but not limited to tungsten, copper, cobalt, molybdenum, and/or ruthenium. In embodiments, the metal of the connector 108 may be formed at the same time the trench connector 106 is formed, for example using a deposition process during the creation of the transistor 100*a*.

Epitaxy, or epitaxial material, refers to a type of crystal growth or material deposition in which new crystalline layers may be formed with one or more well-defined orientations with respect to a crystalline seed layer. The deposited crystalline film may be referred to as an epitaxial film or epitaxial layer. The relative orientation of the epitaxial layer to the seed layer is defined in terms of the orientation of the crystal lattice of each material. For most epitaxial growths, the new layer is usually crystalline and each crystallographic domain of the overlayer must have a well-defined orientation relative to the substrate crystal structure.

In embodiments, the connector 108 may be of a varying width or length, depending upon the conductivity requirements of the electrical connection between the trench connector 106 and the backside connection layer 112. In embodiments, the connector 108 may be orthogonal to a plane of the backside connection layer 112. In embodiments, the connector 108 may not be in direct physical contact with the fins 104, as shown with respect to FIG. 3. In embodiments, there may be multiple connectors 108 (not shown) that electrically couple the trench connector 106 with the backside connection layer 112.

Transistor 100*b*, while similar to transistor 100*a*, shows additional gates 102*a*, 102*b* that may be similar to gate 102, and shows an additional trench connector 106*a*, that may be similar to trench connector 106. In embodiments, connectors 108 that do not include an epitaxial material extend below the trench connectors 106, 106*a*.

Figure 2:
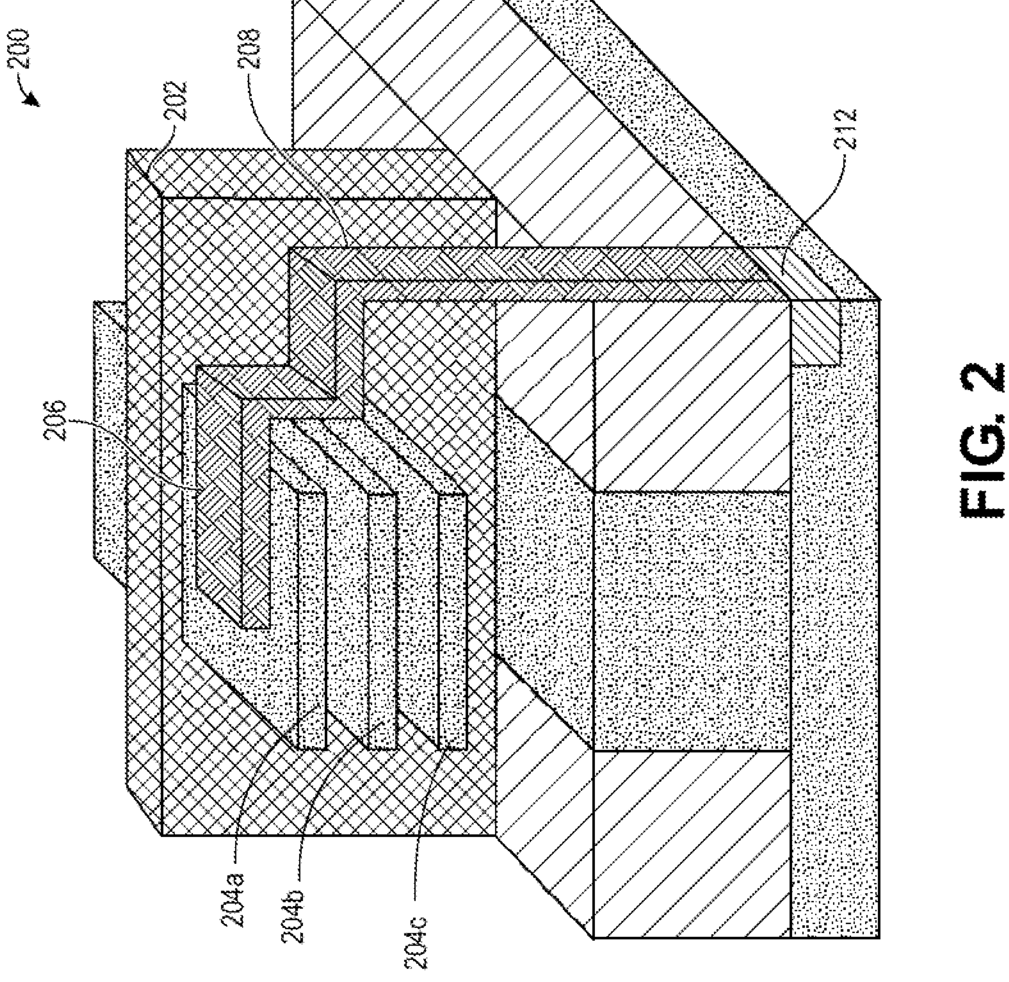
FIG. 2 shows a perspective view of a nanosheet FET transistor that includes a non-epitaxial electrical coupling between a trench connector and a backside connector, in accordance with various embodiments.

FIG. 2 shows a perspective view of a nanosheet FET transistor that includes a non-epitaxial electrical coupling between a trench connector and a backside connector, in accordance with various embodiments. Transistor 200, which may be similar to transistors 100*a*, 100*b* of FIG. 1, includes a gate 202 and fins 204*a*, 204*b*, 204*c* that extend through the gate 202, which may be similar to gate 102 and to fins 104 of FIG. 1.

A trench connector 206, which may be similar to trench connector 106 of FIG. 1, may electrically couple fins 204*a* and 204*b*. A connector 208, which may be similar to connector 108 in FIG. 1, may directly electrically couple with the trench connector 206 to a back side connection layer 212, which may be similar to backside connection layer 112 of FIG. 1. In embodiments, the connector 208 does not include an epitaxial material.

Figure 3:
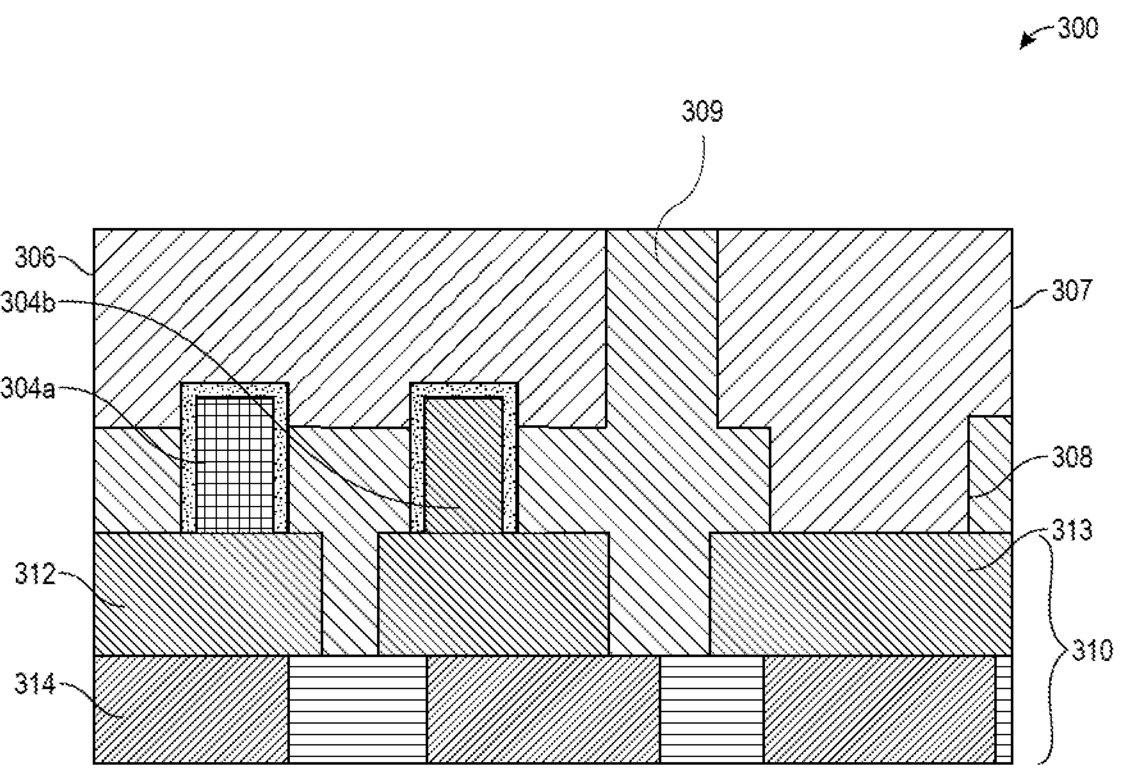
FIG. 3 shows a side view of a FinFET transistor that includes electrical couplings between a trench connector and a backside connector, where the electrical couplings are through an epitaxial fin and a non-epitaxial connector.

FIG. 3 shows a side view of a FinFET transistor that includes electrical couplings between a trench connector and a backside connector, where the electrical couplings are through an epitaxial fin and a non-epitaxial connector. Transistor 300, which may be similar to transistor 100*a* or 100*b* of FIG. 1, includes a backside 310 that may include a BM0 layer 314 and a backside connector layer 312, which may be similar to BM0 layer 114 and backside connector layer 112 of FIG. 1.

Fins 304*a*, 304*b*, which may be similar to fins 104 of FIG. 1 and which include epitaxial material, may be electrically coupled with the backside connector 312. A trench connector 306 may be at a front side of the transistor 300, and may directly electrically couple the fins 304*a*, 304*b* and the backside connector 312. Therefore, the electrical pathway between the trench connector 306, through the fins 304*a*, 304*b*, and to the backside connector 312 is achieved through a high resistance epitaxial material within the fins 304*a*, 304*b* that are part of the electrical pathway. In legacy implementations, the epitaxial portion of the electrical pathway is used to bridge the gap between the front side trench connector 306 and the backside 310 of the transistor because the front side trench connector 306 is not deep enough to contact the backside connector 312.

In contrast, a trench connector 307 at a front side of the transistor 300 is electrically coupled to the backside connector 313 by using connector 308, which may be similar to connector 108 FIG. 1. In embodiments, the connector 308 does not include any epitaxial material, therefore there is less resistance in the electrical connection between the trench connector 307 at the front side and the backside connector 313 at the backside of the transistor 300. Note that a dielectric 309 may separate the trench connector 306 from trench connector 307, as well as separate fin 304*a* from fin 304*b*. In embodiments, there may be a low resistance interface material between trench connector 307 and backside connector 313, for example but not limited to TiN or TaN.

Figure 4A:
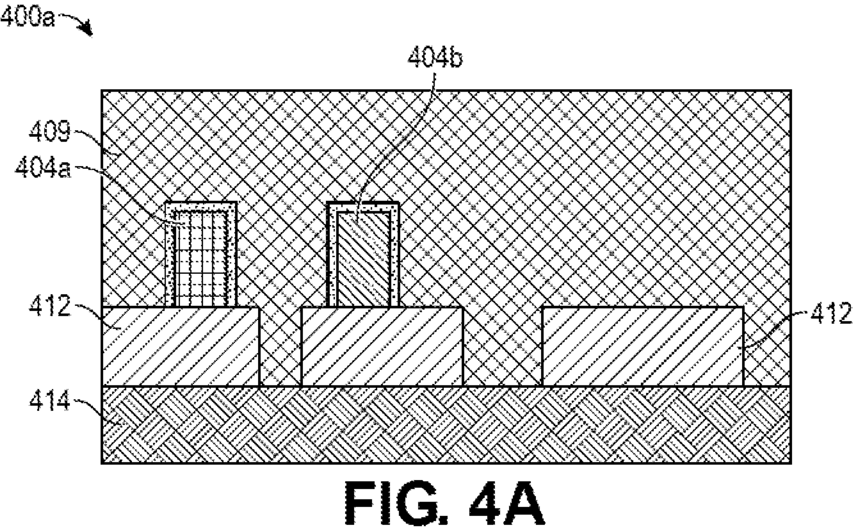
FIGS. 4A-4C show an example legacy implementation of various manufacturing stages of creating an electrical coupling between a trench connector and a backside connector using one or more fins of a FinFET transistor.
Figure 4B:
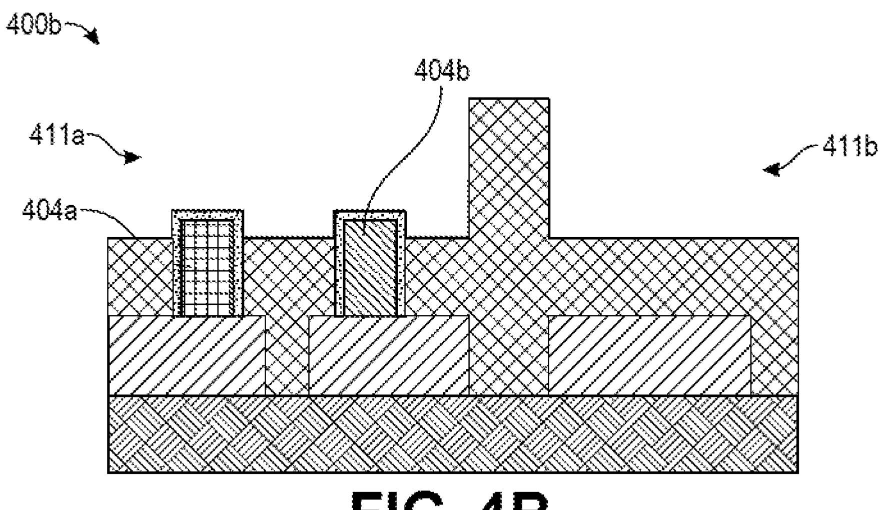
Figure 4C:
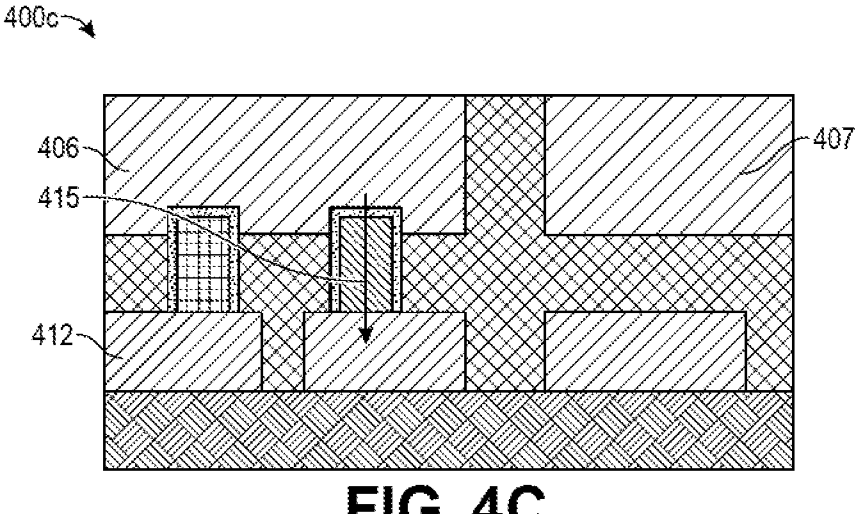

FIGS. 4A-4C show an example legacy implementation of various manufacturing stages of creating an electrical coupling between a trench connector and a backside connector using one or more fins of a FinFET transistor. FIG. 4A shows a cross-section side view of a stage in the manufacturing process of a transistor 400*a*, which may be similar to transistor 300, where a backside connector layer 412, which may be similar to backside connector layer 312 of FIG. 3, is on a substrate 414. In some implementations, the substrate 414 may include a BM0 layer. Fins 404*a*, 404*b*, which may be similar to fins 304*a*, 304*b* of FIG. 3, which include epitaxial material, are physically and electrically coupled with the backside connector layer 412, and are surrounded by a dielectric 409. In some implementations, the dielectric 409 may be referred to as a silicon oxide.

FIG. 4B shows a cross-section side view of a stage in the manufacturing process of a transistor 400*b*, where portions of the dielectric 409 have been removed to create cavities 411*a*, 411*b*. Portions of the fins 404*a*, 404*b* may be exposed by, or may extend into the cavity 411*a*. Implementations, portions of the dielectric 409 may be removed using an etch process or a drill process.

FIG. 4C shows a cross-section side view of a stage in the manufacturing process of a transistor 400*c*, after a patterning process where conductive material 406, 407 is placed in the cavities 411*a*, 411*b*. In implementations, the conductive material 406 may form a trench connector, which may be similar to trench connector 306 of FIG. 3. As a result, an electrical path 415 is established between the conductive material 406, through the fin 404*b*, and to the backside connector layer 412. Note that a similar electrical path passes through the fin 404*a*. Note that the electrical resistance of the electrical path 415 is increased because it passes through epitaxial material in the fin 404*b*.

Figure 5A:
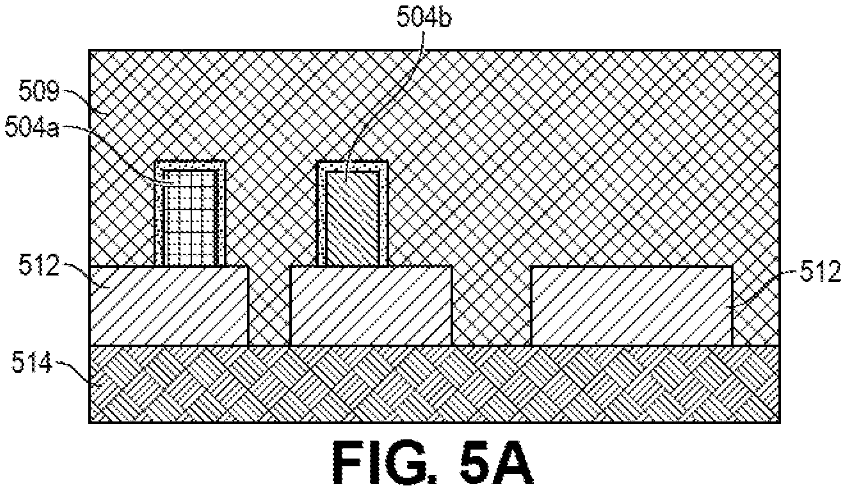
FIGS. 5A-5E shows stages in a manufacturing process for creating an electrical coupling between a trench connector and a backside connector using a non-epitaxial connector, in accordance with various embodiments.

FIGS. 5A-5E shows stages in a manufacturing process for creating an electrical coupling between a trench connector and a backside connector using a non-epitaxial connector, in accordance with various embodiments. FIG. 5A shows a cross-section side view of a stage in the manufacturing process of a transistor, which may be similar to transistor 100*a* of FIG. 1, that includes a backside connector layer 512, which may be similar to backside connector layer 112 of FIG. 1, that is on a substrate 514. In some implementations, the substrate 514 may be a wafer or may be or include a BM0 layer such as BM0 layer 114 of FIG. 1. Fins 504*a*, 504*b*, which include epitaxial material, are physically and electrically coupled with the backside connector layer 512. In embodiments, the fins 504*a*, 504*b* may be grown on the backside connector layer 512. In embodiments, a dielectric material 509 may surround the backside connector layer 512 and the fins 504*a*, 504*b*. In some implementations, the dielectric material 509 may be referred to as a silicon oxide.

Figure 5B:
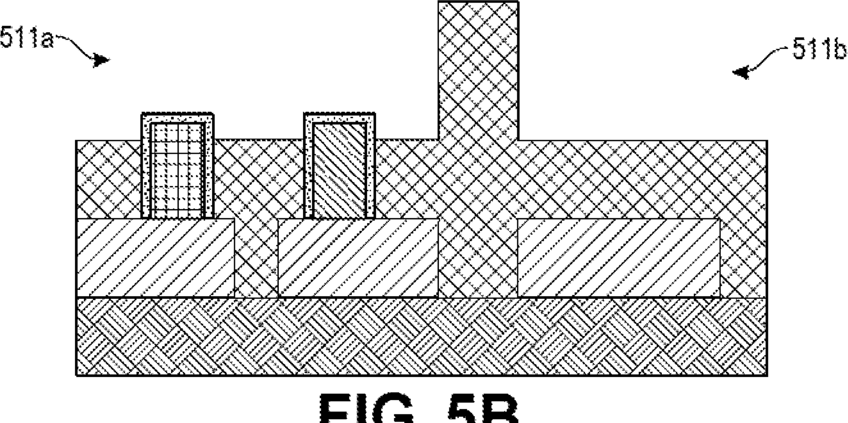

FIG. 5B shows a cross-section side view of a stage in the manufacturing process of a transistor, where portions of the dielectric material 509 have been removed to create cavities 511*a*, 511*b*. Portions of the fins 504*a*, 504*b* may be exposed by, or may extend into the cavity 511*a*. In embodiments, the cavities 511*a*, 511*b* may be formed by a lithography process, an etching process, or a mechanical or laser drill.

Figure 5C:
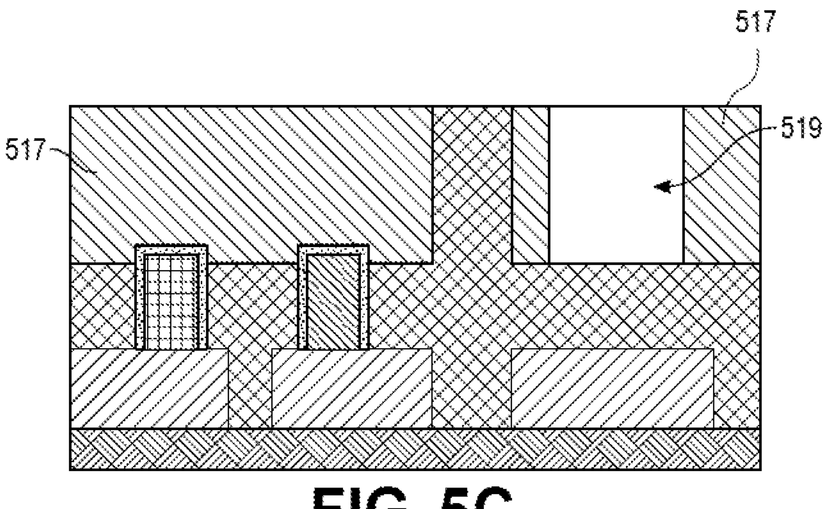

FIG. 5C shows a cross-section side view of a stage in the manufacturing process of a transistor, where a material 517, which may be a carbon hard mask or a high temperature hard mask, may be placed into the cavities 511*a*, 511*b*. The material 517 may then be patterned, and then cavity 519 is formed into the material 517. The forming may use a chemical etching or a drilling process. In embodiments, the etch or drill process may be selective to dielectric material 509.

Figure 5D:
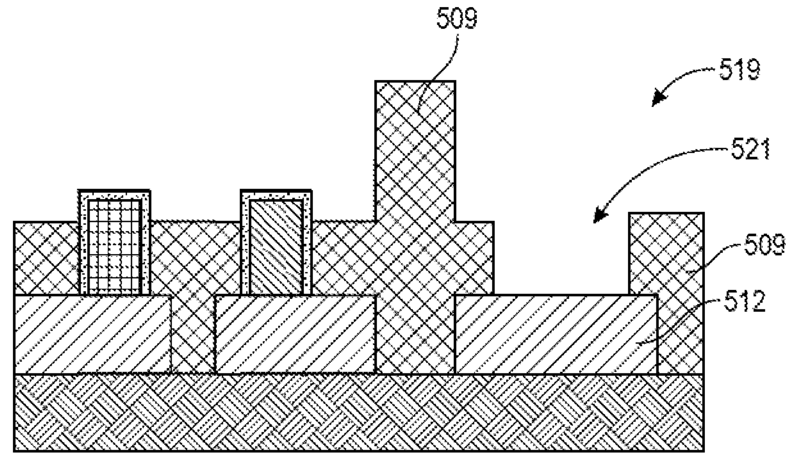

FIG. 5D shows a cross-section side view of a stage in the manufacturing process of a transistor, where a portion of the dielectric material 509 is removed to form a cavity 521. In embodiments, the cavity 521 exposes a surface of the backside connector layer 512. In embodiments, the forming may use a chemical etching or a drilling process.

Figure 5E:
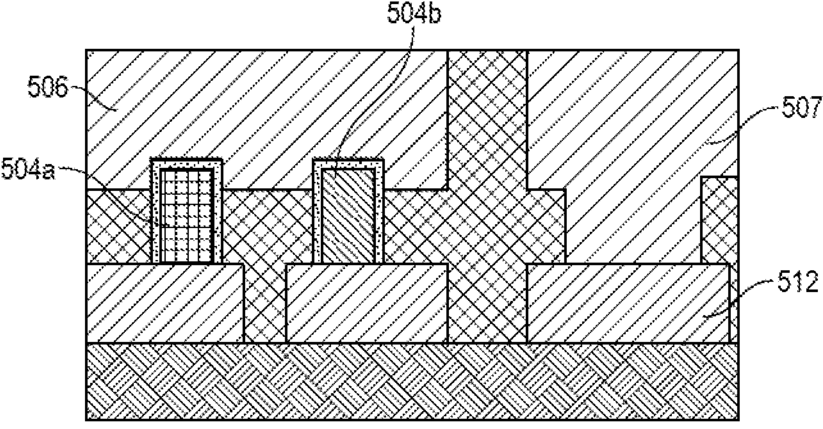

FIG. 5E shows a cross-section side view of a stage in the manufacturing process of a transistor, where a conductive material 506, 507 is deposited into the cavities 511*a*, 519, and 521. In embodiments, the conductive material 506, 507 may include a metal, a metal alloy, or a metal compound. In embodiments, the conductive material 506 may serve the function as a trench connector that electrically couples the fins 504*a*, 504*b*. In embodiments, the conductive material 507 creates an electrical pathway to the backside connector 512, where the electrical pathway does not include an epitaxial material. In this way, a lower resistance for the electrical pathway may be achieved using the conductive material 507.

Figure 6:
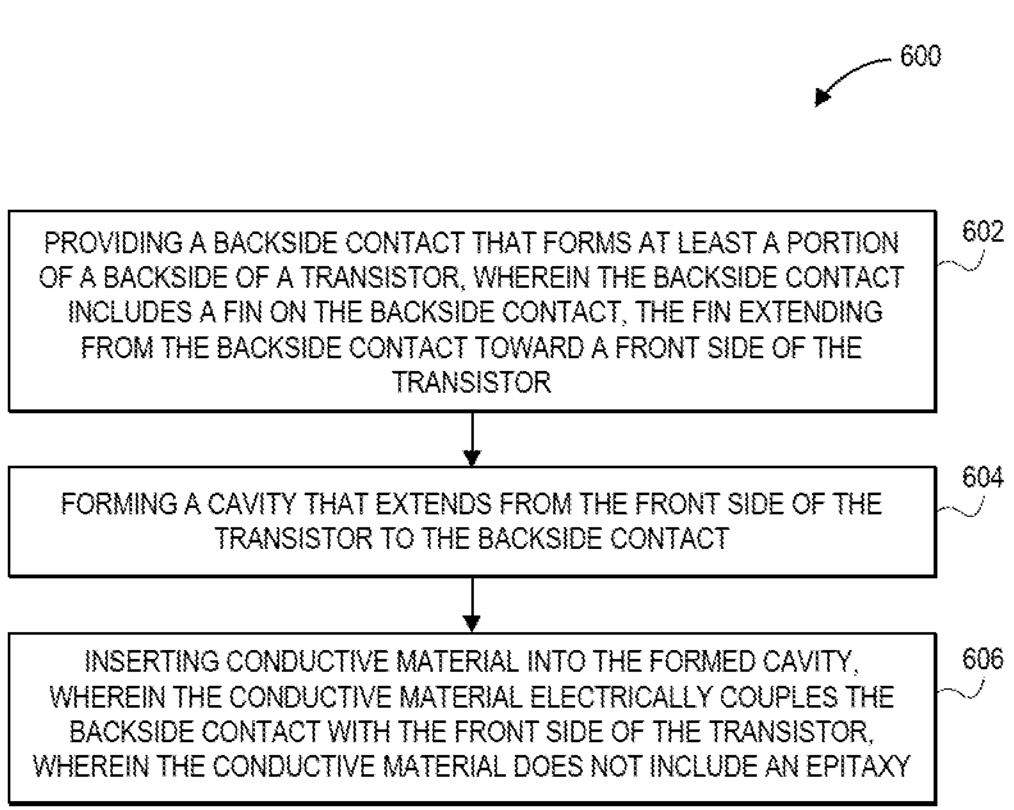
FIG. 6 shows a process for creating an electrical coupling between a trench connector and a backside connector using a non-epitaxial connector, in accordance with various embodiments.

FIG. 6 shows a process for creating an electrical coupling between a trench connector and a backside connector using a non-epitaxial connector, in accordance with various embodiments. The process described with respect to FIG. 6 may include systems, apparatus, processes, techniques, and/or actions described with respect to FIGS. 1-5E.

At block 602, the process may include providing a backside contact that forms at least a portion of a backside of a transistor, wherein the backside contact includes a fin on the backside contact, the fin extending from the backside contact toward a front side of the transistor. In embodiments, the transistor may be similar to transistor 100*a*, the backside of the transistor may be similar to backside of the transistor 110, the backside contact may be similar to backside contact 112, and the fins may be similar to fins 104 of FIG. 1.

At block 604, the process may further include forming a cavity that extends from the front side of the transistor to the backside contact. In embodiments, the cavity may be similar to cavities 519, 521 of FIG. 5D.

At block 606, the process may further include inserting conductive material into the formed cavity, wherein the conductive material electrically couples the backside contact with the front side of the transistor, wherein the conductive material does not include an epitaxy. in embodiments, the conductive material may be similar to conductive material 506, 507 of FIG. 5E, or may be similar to the material used in the connector 108 and in trench contact 106 of FIG. 1.

Figure 7A:
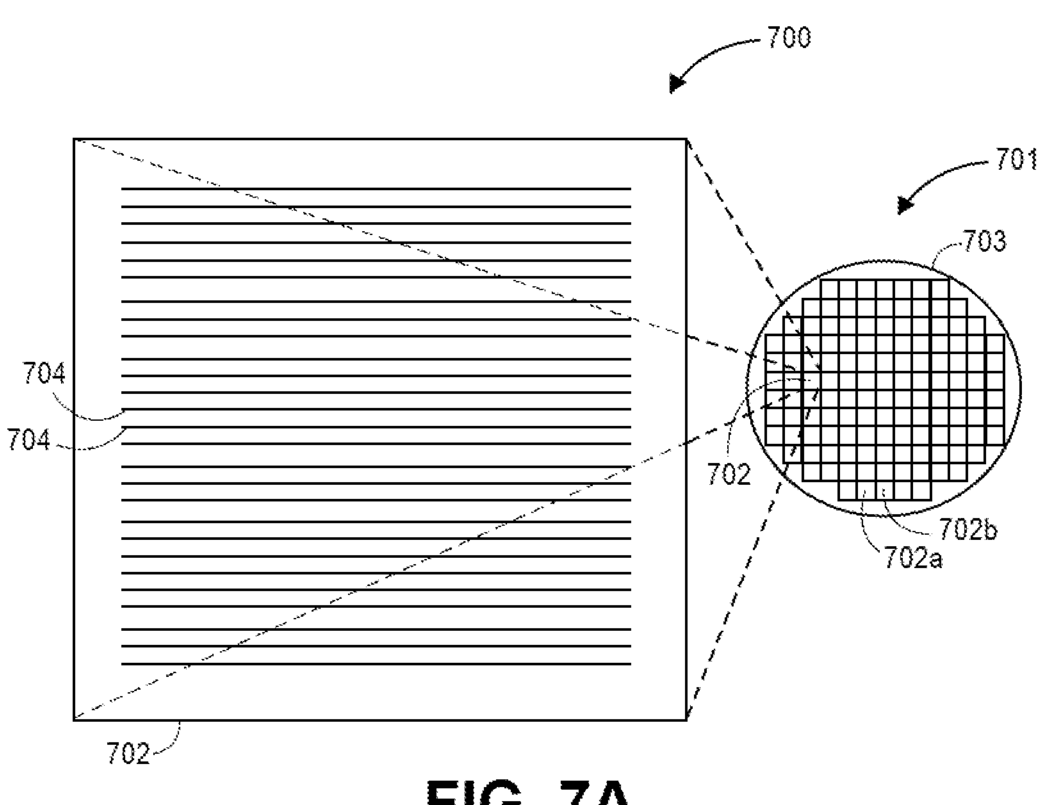
FIGS. 7A-7B schematically illustrate a top view of an example die in wafer form and in singulated form, and a cross-section side view of a package assembly, in accordance with various embodiments.
Figure 7B:
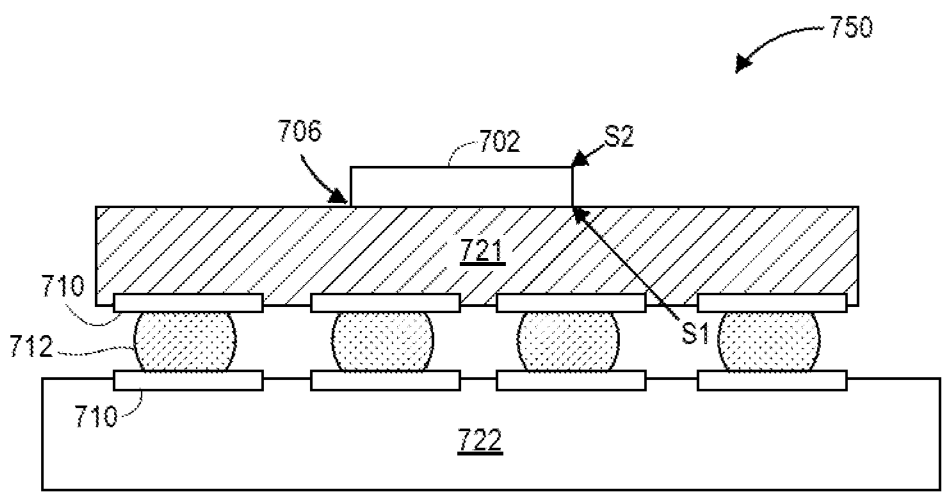

FIGS. 7A-7B schematically illustrate a top view of an example die in wafer form and in singulated form, and a cross-section side view of a package assembly, in accordance with various embodiments. FIG. 7A schematically illustrates a top view of an example die 702 in a wafer form 701 and in a singulated form 700, in accordance with some embodiments. In some embodiments, die 702 may be one of a plurality of dies, e.g., dies 702, 702*a*, 702*b*, of a wafer 703 comprising semiconductor material, e.g., silicon or other suitable material. The plurality of dies, e.g., dies 702, 702*a*, 702*b*, may be formed on a surface of wafer 703. Each of the dies 702, 702*a*, 702*b*, may be a repeating unit of a semiconductor product that includes devices as described herein. For example, die 702 may include circuitry having elements such as capacitors and/or inductors 704 (e.g., fin structures, nanowires, and the like) that provide a channel pathway for mobile charge carriers in transistor devices. Although one or more capacitors and/or inductors 704 are depicted in rows that traverse a substantial portion of die 702, it is to be understood that one or more capacitors and/or inductors 704 may be configured in any of a wide variety of other suitable arrangements on die 702 in other embodiments.

After a fabrication process of the device embodied in the dies is complete, wafer 703 may undergo a singulation process in which each of dies, e.g., die 702, is separated from one another to provide discrete "chips" of the semiconductor product. Wafer 703 may be any of a variety of sizes. In some embodiments, wafer 703 has a diameter ranging from about 25.4 mm to about 450 mm. Wafer 703 may include other sizes and/or other shapes in other embodiments. According to various embodiments, the one or more capacitors and/or inductors 704 may be disposed on a semiconductor substrate in wafer form 701 or singulated form 700. One or more capacitors and/or inductors 704 described herein may be incorporated in die 702 for logic, memory, or combinations thereof. In some embodiments, one or more capacitors and/or inductors 704 may be part of a system-on-chip (SoC) assembly.

FIG. 7B schematically illustrates a cross-section side view of an integrated circuit (IC) assembly 750, in accordance with some embodiments. In some embodiments, IC assembly 750 may include one or more dies, e.g., die 702, electrically or physically coupled with a package substrate 721. Die 702 may include one or more capacitors and/or inductors 704 as described herein and in FIG. 7B. In some embodiments, package substrate 721 may be electrically coupled with a circuit board 722 as is well known to a person of ordinary skill in the art. Die 702 may represent a discrete product made from a semiconductor material (e.g., silicon) using semiconductor fabrication techniques such as thin film deposition, lithography, etching, and the like. In some embodiments, die 702 may be, include, or be a part of a processor, memory, a system on chip (SoC) or application-specific integrated circuit (ASIC).

Die 702 can be attached to package substrate 721 according to a wide variety of suitable configurations including, for example, being directly coupled with package substrate 721 in a flip-chip configuration, as depicted. In the flip-chip configuration, an active side S1 of die 702 including circuitry is attached to a surface of package substrate 721 using hybrid bonding structures as described herein that may also electrically couple die 702 with package substrate 721. Active side S1 of die 702 may include multi-threshold voltage transistor devices as described herein. An inactive side S2 of die 702 may be disposed opposite to active side S1.

In some embodiments, package substrate 721 is an epoxy-based laminate substrate having a core and/or build-up layers such as, for example, an Ajinomoto Build-up Film (ABF) substrate. Package substrate 721 may include other suitable types of substrates in other embodiments including, for example, substrates formed from glass, ceramic, or semiconductor materials.

Package substrate 721 may include electrical routing features configured to route electrical signals to or from die 702. The electrical routing features may include pads or traces (not shown) disposed on one or more surfaces of package substrate 721 and/or internal routing features (not shown) such as trenches, vias, or other interconnect structures to route electrical signals through package substrate 721. In some embodiments, package substrate 721 may include electrical routing features such as pads (not shown) configured to receive the respective die-level interconnect structures 706 of die 702.

Circuit board 722 may be a printed circuit board (PCB) comprising an electrically insulative material such as an epoxy laminate. Circuit board 722 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 702 through circuit board 722. Circuit board 722 may comprise other suitable materials in other embodiments. In some embodiments, circuit board 722 is a motherboard as is well known to a person of ordinary skill in the art.

Package-level interconnects such as, for example, solder balls 712 may be coupled to one or more pads 710 on package substrate 721 and/or on circuit board 722 to form corresponding solder joints that are configured to further route the electrical signals between package substrate 721 and circuit board 722. Pads 710 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 721 with circuit board 722 may be used in other embodiments.

IC assembly 750 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 702 and other components of IC assembly 750 may be used in some embodiments.

A person of ordinary skill in the art should recognize that any known semiconductor device fabricated using any known semiconductor process that may benefit from the principles described herein.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 8:
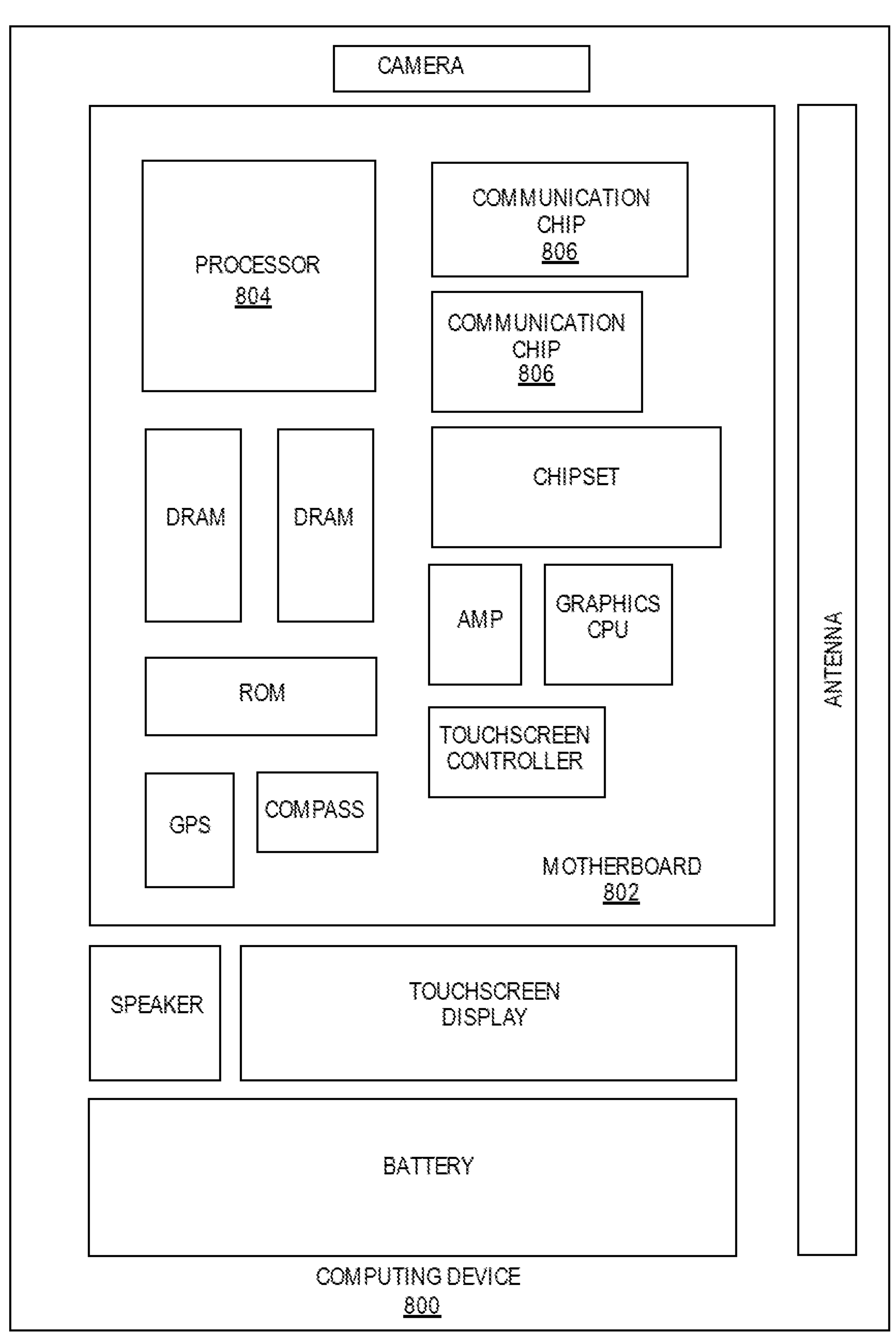
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
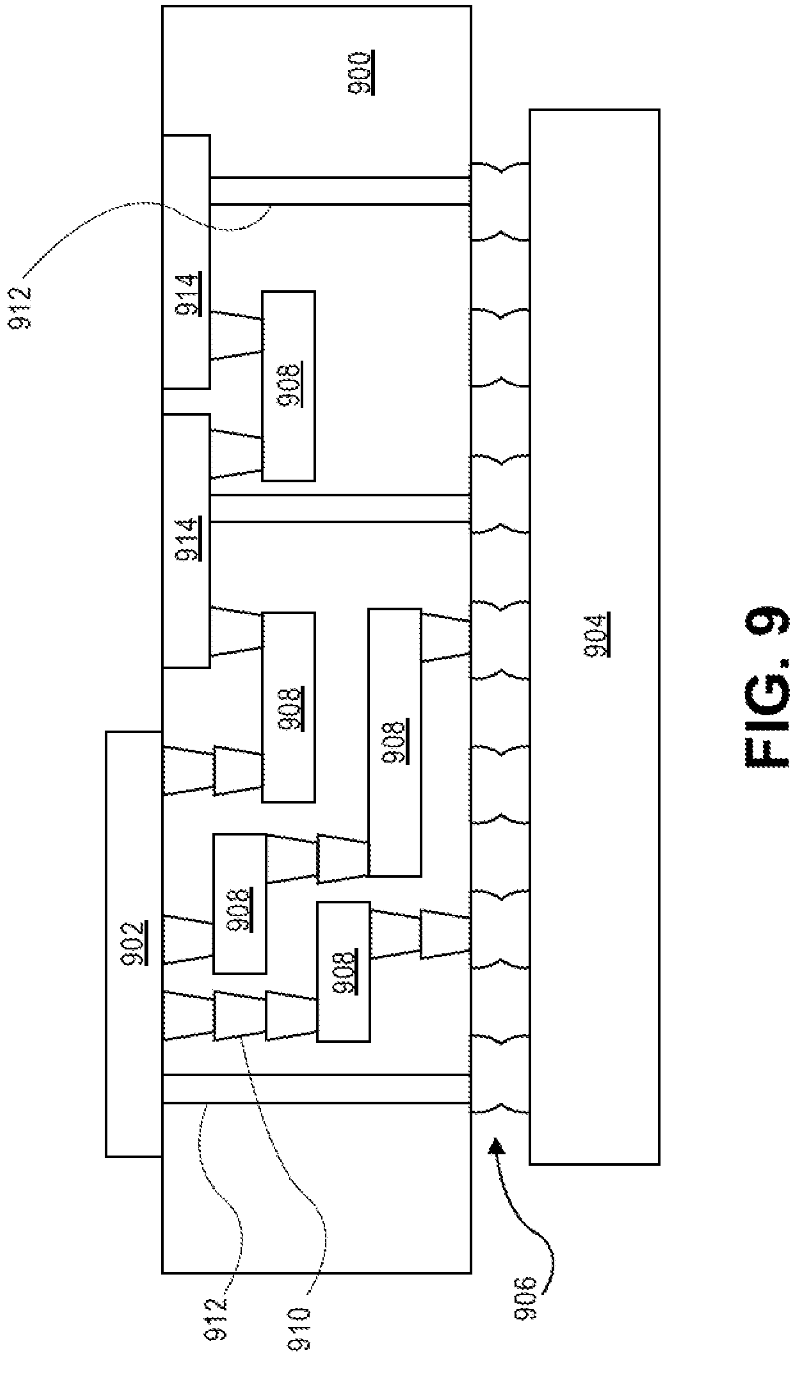
FIG. 9 illustrates an interposer that includes one or more embodiments of the invention.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the invention, apparatuses or processes disclosed herein may be used in the fabrication of interposer 900.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor comprising: a gate; a fin extending through the gate; a conductive layer below the gate; a trench connector directly electrically coupled with the fin; and a connector directly electrically coupled with the trench connector and with at least a portion of the conductive layer, wherein the connector is a metal.

Example 2 may include the transistor of example 1, or of any other example or embodiment described herein, wherein the connector does not include an epitaxy.

Example 3 may include the transistor of example 1, or of any other example or embodiment described herein, wherein the conductive layer is at a back side of the transistor or the trench connector is at a front side of the transistor.

Example 4 may include the transistor of example 1, or of any other example or embodiment described herein, wherein the conductive layer is a backside connector.

Example 5 may include the transistor of example 4, or of any other example or embodiment described herein, further comprising a metal zero layer beneath the conductive layer, wherein the backside connector is electrically coupled with the metal zero layer.

Example 6 may include the transistor of example 1, or of any other example or embodiment described herein, wherein the trench connector and the connector include a metal.

Example 7 may include the transistor of example 1, or of any other example or embodiment described herein, wherein the fin is a plurality of fins, and wherein the trench connector is directly electrically coupled with the plurality of fins.

Example 8 may include the transistor of example 1, or of any other example or embodiment described herein, wherein the trench connector is a plurality of trench connectors, wherein the connector is a plurality of connectors; and wherein the plurality of trench connectors are directly electrically coupled, respectively, with the plurality of connectors.

Example 9 may include the transistor of example 1, or of any other example or embodiment described herein, wherein the fin includes an epitaxy, and wherein the fin electrically couples the trench connector with the conductive layer.

Example 10 may include the transistor of example 1, or of any other example or embodiment described herein, wherein the fin is parallel to a direction of the gate.

Example 11 may include the transistor of example 1, or of any other example or embodiment described herein, wherein the gate is a plurality of gates.

Example 12 is a package comprising: an electrical component; and a transistor electrically coupled with the electrical component, the transistor comprising: a front side and a backside opposite the front side; a first trench connector at the front side of the transistor; a second trench connector at the backside of the transistor; and a connector directly electrically coupling the first trench connector with the second trench connector, wherein the connector is a metal.

Example 13 may include the package of example 12, or of any other example or embodiment described herein, further comprising: a gate; a fin extending through the gate; and wherein the first trench connector is directly electrically coupled with the fin.

Example 14 may include the package of example 13, or of any other example or embodiment described herein, wherein the fin includes a plurality of fins; wherein the first trench connector is directly electrically coupled with the plurality of fins; and wherein the connector does not include an epitaxy.

Example 15 may include the package of example 14, or of any other example or embodiment described herein, wherein the plurality of fins are substantially parallel and overlap each other in a direction parallel to a direction of the gate.

Example 16 may include the package of example 14, or of any other example or embodiment described herein, wherein the plurality of fins are substantially parallel and overlap each other in a direction perpendicular to a direction of the gate.

Example 17 may include the package of example 13, or of any other example or embodiment described herein, wherein the gate is a plurality of gates, and wherein the fin extends through the plurality of gates.

Example 18 may include the package of example 13, or of any other example or embodiment described herein, wherein the fin includes epitaxy.

Example 19 may include the package of example 12, or of any other example or embodiment described herein, wherein the electrical component is a selected one or more of: a memory, an inductor, or a capacitor.

Example 20 may include the package of example 12, or of any other example or embodiment described herein, wherein the second trench connector at the backside of the transistor includes a metal zero layer.

Example 21 is a method comprising: providing a backside contact that forms at least a portion of a backside of a transistor, wherein the backside contact includes a fin on the backside contact, the fin extending from the backside contact toward a front side of the transistor; forming a cavity that extends from the front side of the transistor to the backside contact; and inserting conductive material into the formed cavity, wherein the conductive material electrically couples the backside contact with the front side of the transistor, wherein the conductive material is a metal.

Example 22 may include the method of example 21, or of any other example or embodiment described herein, wherein providing the backside contact further includes providing a dielectric between the backside contact and the front side of the transistor; and wherein forming the cavity further includes forming the cavity through the dielectric.

Example 23 may include the method of example 21, or of any other example or embodiment described herein, wherein the fin includes an epitaxy, and wherein the conductive material does not include an epitaxy.

Example 24 may include the method of example 21, or of any other example or embodiment described herein, wherein providing the backside contact further includes providing a gate at the front side of the transistor, wherein the fin extends through the gate.

Example 25 may include the method of example 24, or of any other example or embodiment described herein, wherein inserting the conductive material into the formed cavity further includes directly electrically coupling the conductive material with a portion of the fin.

What is claimed is:

1. A transistor comprising:

a gate;

a fin extending through the gate;

a conductive layer below the gate, the conductive layer having a first portion distinct from and laterally spaced apart from a second portion;

a trench connector directly electrically coupled with the fin; and a connector directly electrically coupled with the trench connector, wherein the connector comprises metal, and wherein the connector has a bottom surface at a same level as a bottom surface of the fin, the bottom surface of the connector in direct contact with the first portion of the conductive layer, and the bottom surface of the fin in direct contact with the second portion of the conductive layer.

2. The transistor of claim 1, wherein the connector does not include an epitaxy.

3. The transistor of claim 1, wherein the conductive layer is at a back side of the transistor or the trench connector is at a front side of the transistor.

4. The transistor of claim 1, wherein the conductive layer is a backside connector.

5. The transistor of claim 4, further comprising a metal zero layer beneath the conductive layer, wherein the backside connector is electrically coupled with the metal zero layer.

6. The transistor of claim 1, wherein the trench connector and the connector include a metal.

7. The transistor of claim 1, wherein the fin is a plurality of fins, and wherein the trench connector is directly electrically coupled with the plurality of fins.

8. The transistor of claim 1, wherein the trench connector is a plurality of trench connectors, wherein the connector is a plurality of connectors; and wherein the plurality of trench connectors are directly electrically coupled, respectively, with the plurality of connectors.

9. The transistor of claim 1, wherein the fin includes an epitaxy, and wherein the fin electrically couples the trench connector with the conductive layer.

10. The transistor of claim 1, wherein the fin is parallel to a direction of the gate.

11. The transistor of claim 1, wherein the gate is a plurality of gates.

12. A package comprising:

an electrical component;

a transistor electrically coupled with the electrical component, the transistor comprising:

a front side and a backside opposite the front side;

a fin;

a first trench connector at the front side of the transistor;

a second trench connector and a third trench connector at the backside of the transistor, the third trench connector distinct from and laterally spaced apart from the second trench connector;

a connector directly electrically coupling the first trench connector with the second trench connector, wherein the connector comprises metal, and wherein the connector has a bottom surface at a same level as a bottom surface of the fin, the bottom surface of the connector in direct contact with the second trench connector, and the bottom surface of the fin in direct contact with the third trench connector.

13. The package of claim 12, further comprising:

a gate;

the fin extending through the gate; and wherein the first trench connector is directly electrically coupled with the fin.

14. The package of claim 13, wherein the fin includes a plurality of fins; wherein the first trench connector is directly electrically coupled with the plurality of fins; and wherein the connector does not include an epitaxy.

15. The package of claim 14, wherein the plurality of fins are substantially parallel and overlap each other in a direction parallel to a direction of the gate.

16. The package of claim 14, wherein the plurality of fins are substantially parallel and overlap each other in a direction perpendicular to a direction of the gate.

17. The package of claim 13, wherein the gate is a plurality of gates, and wherein the fin extends through the plurality of gates.

18. The package of claim 13, wherein the fin includes epitaxy.

19. The package of claim 12, wherein the electrical component is a selected one or more of: a memory, an inductor, or a capacitor.

20. The package of claim 12, wherein the second trench connector at the backside of the transistor includes a metal zero layer.

* * * * *